United States Patent [19]

Melcher et al.

[11] 4,217,183

[45] Aug. 12, 1980

[54] METHOD FOR LOCALLY ENHANCING ELECTROPLATING RATES

[75] Inventors: Robert L. Melcher, Yorktown Heights; Robert J. von Gutfeld, New York, both of N.Y.

[73] Assignee: International Business Machines Corporation, Armonk, N.Y.

[21] Appl. No.: 37,075

[22] Filed: May 8, 1979

[51] Int. Cl.² .......................... C25D 5/02; C25D 5/16
[52] U.S. Cl. ................................ 204/15; 204/224 R; 204/DIG. 7
[58] Field of Search ................ 204/15, 224 R, DIG. 7

[56] References Cited

U.S. PATENT DOCUMENTS

| | | | |
|---|---|---|---|
| 3,013,955 | 12/1961 | Roberts | 204/15 |
| 3,322,231 | 5/1967 | Gourney | 181/0.5 |
| 3,345,274 | 10/1967 | Schmidt | 204/15 |
| 3,345,275 | 10/1967 | Schmidt | 204/15 |
| 3,506,545 | 4/1970 | Garwin et al. | 204/15 |
| 3,529,961 | 9/1970 | Schaefer et al. | 204/15 |
| 3,810,829 | 5/1974 | Fletcher | 204/222 |
| 3,848,104 | 11/1974 | Locke | 219/121 L |
| 4,024,029 | 5/1977 | Rain et al. | 204/15 |
| 4,161,436 | 7/1979 | Gould | 204/157.1 R |

FOREIGN PATENT DOCUMENTS

| | | | |
|---|---|---|---|
| 2348182 | 4/1975 | Fed. Rep. of Germany | 204/15 |
| 1295071 | 7/1961 | France | 204/15 |
| 50-92830 | 7/1975 | Japan | 204/15 |

OTHER PUBLICATIONS

*Ultrasonics,* Mar. 1975, pp. 79–82.
*Electrochemical Society Abstract,* No. 161, by M. P. Drake, vol. 78-2, p. 434 (1978).
*Electrochimica Acta.,* vol. 118, p. 619 (1973).
*Electrochemical Society Abstract,* No. 286, by B. L. Bestel et al., vol. 77, No. 2, p. 759 (1977).
*Proceedings of the IEEE,* vol. 57, No. 1, p. 21, Jan. 1969.
*Insulation/Circuits,* pp. 23, 24, Jul. 1978.

*Primary Examiner*—T. M. Tufariello
*Attorney, Agent, or Firm*—Michael J. Weins

[57] ABSTRACT

A method for high resolution maskless electroplating is described. Preferential plating results from exposing those regions where enhanced plating is sought to a collimated energy beam. Such exposure can produce an enhancement in the plating rate of $10^3$, which is sufficient to eliminate the necessity of masking the surface.

15 Claims, 2 Drawing Figures

METHOD FOR LOCALLY ENHANCING ELECTROPLATING RATES

DESCRIPTION

1. Technical Field

This invention relates generally to a method for locally enhancing electroplating rates and more particularly to a maskless technique for establishing high resolution patterns plated onto a substrate.

Copending applications 037,074 and 037,073 both of which were filed May 8, 1979, respectively treat method for locally enhancing the rate of chemical and electrochemical machining, and for locally enhancing the rate of electroless plating.

2. Background Art

Classical methods of preferential plating require multiple steps. The surface to be plated must be first masked and then subsequently plated after which the masking is stripped. These multiple steps are time consuming and increase the cost of the process.

It has been found that arbitrary patterns may be plated onto a photoconductor by appropriately exposing the photoconductor to light. C. S. Roberts in U.S. Pat. No. 3,013,955 teaches exposing doped regions of silicon to light providing a photovoltaic effect which promotes plating in those doped regions exposed to light.

P. F. Schmidt in U.S. Pat. No. 3,345,274 and P. F. Schmidt et al in U.S. Pat. No. 3,345,275 teaches the anodization of a photoconductor substrate by exposing to light those areas which are to be anodized.

While the Roberts, Schmidt and the Schmidt et al techniques teach methods of forming preferential patterns on substrates by exposing the substrates or portions thereof to light, these techniques are limited to photoconducting substrates. They do not teach an enhancing of the plating rate as a function of the strength of the light source.

R. L. Garwin et al U.S. Pat. No. 3,506,545 which is assigned to the assignee of the present application teaches a method that does not require a photoconducting substrate. Garwin et al teaches locally heat treating the regions to be plated by laser annealing. These regions which are annealed or heat treated become substantially more conductive than the non heat treated regions thereby increasing the plating rate. The Garwin et al patent teaches the use of this technique for amorphous semiconducting substrates which upon heat treating or annealing become crystalline. While this technique overcomes the necessity of having a photoconducting substrate, it is of limited utility in that it requires a heat treatable substrate which when heat treated becomes substantially more conducting.

K. Walker and C. T. Walker in an article entitled "New Explanations for Brightness of Electro-deposits by Ultrasound", Ultrasonics, pages 79–82 (March 1975), have noted that ultrasonic agitation has been observed to considerably increase the critical current density and thereby the plating rate.

M. P. Drake in an abstract for a presentation to Electrochemical Society, Abstract No. 161, Vol. 78-2, page 434, (1978) Pittsburgh, Pa., has pointed out that a threefold enhancement in the plating rate of gold can be obtained by exposing a substrate to ultrasound where the power input is 4 W/cm$^2$. While this technique will produce preferential plating, the ratio of the background plating to the preferred plating is only a factor of three which is not sufficient to provide well resolved plating patterns without masking.

A. A. Wragg and A. K. Nasiruddin in Electrochimica Acta, Vol. 118, page 619 (1973), report that heating of a substrate to 91° C. will produce an increase in the plating region of approximately 7 fold and with nucleation of boiling this increase has approached a factor of 50. Thus, heating of the cathode would produce preferential plating but would be subject to the limitations as have been discussed with respect to the Drake technique.

B. L. Bestel et al in an abstract of Electrochemical Society, Abstract 286, Vol. 77, No. 2, page 759 (1977) teaches that patterns may be electroplated onto a cathode by a jet stream technique. This technique impinges onto a cathode a stream which also serves as the anode. However, this technique requires specialized equipment and its resolution will be limited by the stream size which is practically limited to about ½ mil. Greater resolution is possible, however it becomes difficult to produce the nozzles for providing finer streams. Furthermore, there is a tendency for the nozzles to plug in use. A final limitation to employing the technique is the difficulty in scanning the surface to establish a pattern.

DISCLOSURE OF INVENTION

An object of the present invention is to disclose a method for maskless plating onto an electrically conductive surface. Another object of this invention is to provide a method for enhanced electro-deposition rates. Still another object of this invention is to provide a method for depositing onto a substrate which is suitable for personalization of integrated circuits. Various other objects and advantages of the present invention will become apparent to those skilled in the art from the following description and suggested industrial applications.

The practice of the present invention allows one to preferentially electroplate selective areas of a cathode while minimizing the background plating in adjacent regions. A cathode is placed in a solution which is an electrolyte. Preferably, the cathode is chosen to have an electrically nonconducting substrate which is relatively thermally insulating and rendered electrically conducting by depositing onto its surface a metallic layer. An anode is placed in the electrolyte and spaced apart from the cathode.

An energy source is focused on the regions of the surface of the cathode where the energy is absorbed, causing localized heating. An electrolytic cell is established by applying an electric potential between the positive anode and the negative cathode. In the locally heated region the plating rate is enhanced over the background plating rate in the non heat effected zones.

Best Mode for Carrying Out the Invention

Figure 1:
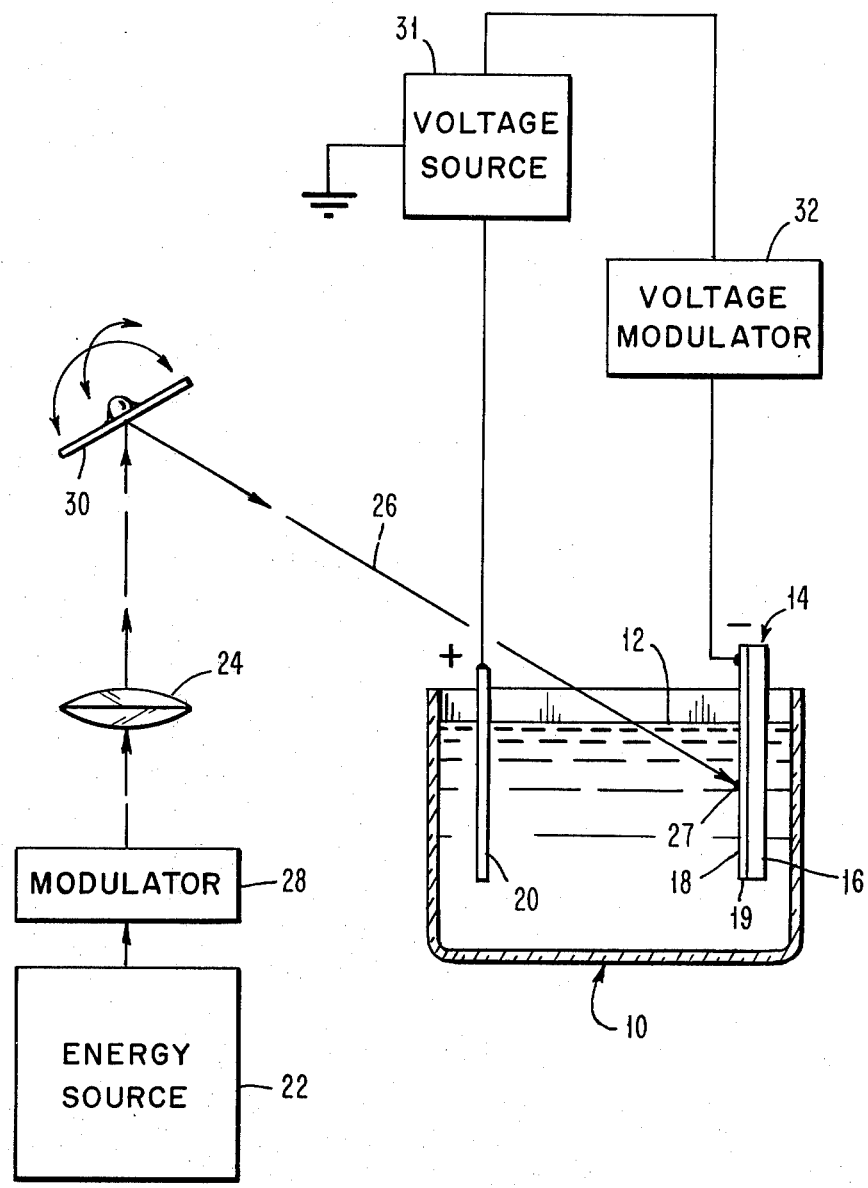
FIG. 1 is one embodiment of the present invention illustrating an energy beam impinging on the surface where preferential plating is sought.
Figure 2:
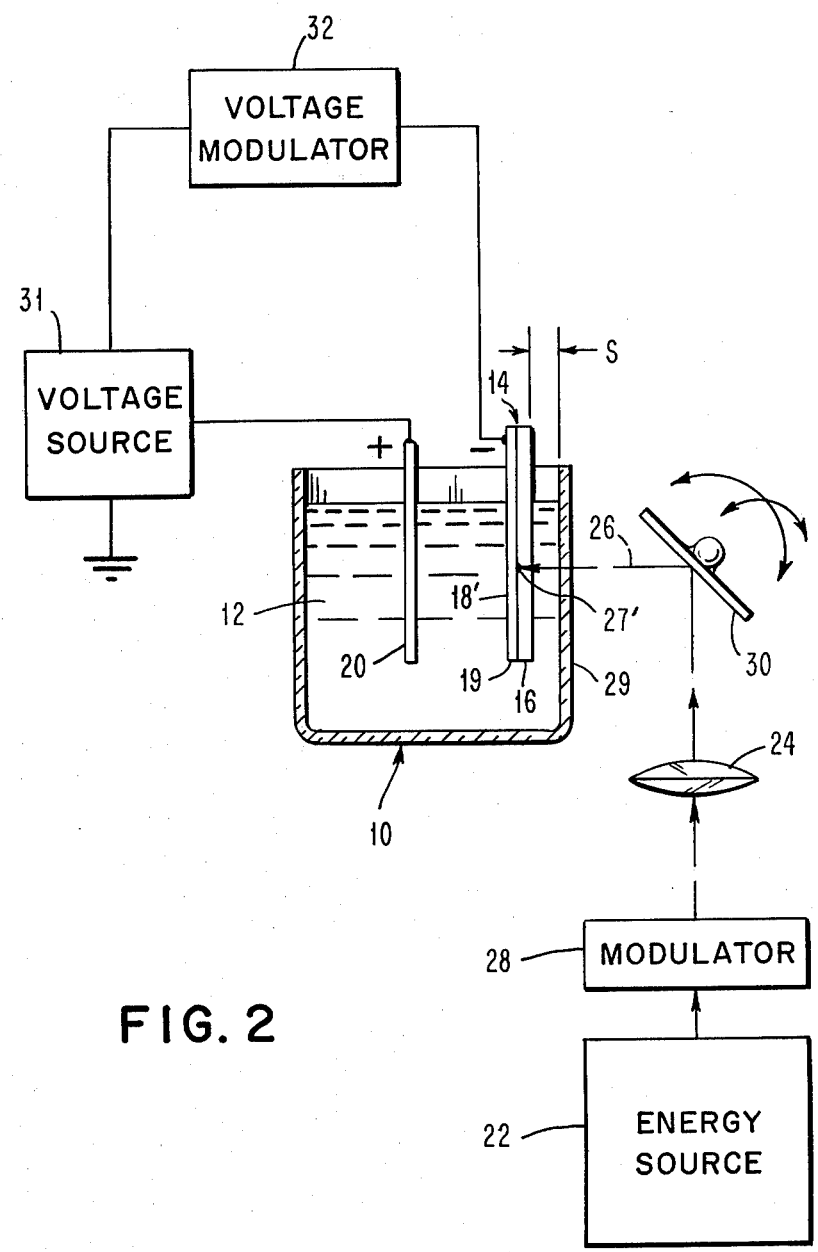
FIG. 2 is a second embodiment of the present invention illustrating an energy beam impinging on the side opposite the surface where enhanced plating is sought.

The practice for this mode will be described in reference to FIGS. 1 and 2. There is shown in FIG. 1, a vessel 10 which contains an electrolyte 12. A cathode 14 is immersed in the electrolyte 12. The cathode 14 may be a metal, a photoconductor or a composite structure of an insulator and a conductor.

When the cathode 14 is a composite, it is prepared to have a thermally nonconducting substrate 16. Typically the substrate may be of a material such as glass or other dielectric. The thermally insulating substrate 16 is rendered electrically conducting by depositing onto the surface 18 a thin metallic layer 19. Metal such as tungsten, molybdenum, nickel, copper will serve to make the thermally insulating substrate 16 conducting. It is preferred to have the thickness of the predeposited metallic layer 19 between about 300 Å and 10,000 Å. The lower limit is sufficient to provide adequate electrical conductivity while the upper limit still assures limited thermal conductivity of the composite cathode and prevents undue thermal spreading of the locally heated region.

An anode 20 is placed in the electrolyte 12 and is spaced apart from the cathode 14. The anode may be made of any suitable material such as platinum, palladium or another noble metal or noble metal compound.

An energy source 22 is focused by a lens system 24 forming a beam 26 which passes through the electrolyte 12 and impinges upon the metallic layer 19 of the cathode 14. Electromagnetic radiation in the visible and infrared spectrum is particularly useful since its wavelength can be selected so as not to be strongly absorbed by the electrolyte 12 while being strongly absorbed by the cathode 14. The radiation may be focused by the lens system 24 so that the beam 26 exposes a region 27 at the metallic surface 18 of the cathode 14. The beam 26 may be manipulated by a scanning mirror 30 whose angular rotation will allow a predetermined portion of the cathode 14 to be exposed to the beam 26. Alternatively, it is possible to employ a stationary beam 26 and to move the cathode 14 to allow a predetermined portion of the cathode 14 to be exposed.

When electromagnetic radiation in the visible range is employed it can be generated from a carbon arc but preferably a laser light source such as a continuous multimode or single mode argon laser or a krypton tunable laser is also an acceptable light source. The laser provides a high intensity energy source 18 and eliminates the necessity of a lens system 200 unless further focusing is desired to reduce the collimated beam size 22. The intensity of the light in all cases should be sufficient to provide a beam 22 with an intensity preferably between about $10^2$ to $10^6$ W/cm$^2$.

The lower limit is required to produce enhancement in the plating rate. It should be pointed out this value is substantially above those values required to sensitize most photoconductors. Thus, the present invention is clearly distinguishable from those of U.S. Pat. Nos. 3,013,955, 3,345,274, and 3,345,275.

The upper limit should be chosen so as to avoid thermal transformations of the structure of the cathode 14. In general, this will limit the maximum power input to about $10^6$ W/cm$^2$ for exposures longer than microseconds and proportionally higher powers for shorter pulse durations.

When the light beam 26 passes through electrolyte 12 care must be taken in selecting the wavelength of the light to avoid strong absorbtion by the electrolyte 12. If for example, Ni and Cu solutions are employed as electrolytes an argon laser would provide an acceptable spectrum while if Au solutions are used then a krypton laser tuned to 6471 Å would provide a light beam 26 not strongly absorbed by the electrolyte 12.

Alternative plating schemes are available where the light beam 26 need not pass through the electrolyte 12. For these cases the absorbtive character of the electrolyte need not be considered. FIG. 2 illustrates one such system. In this case the vessel 10 and the substrate 16 are chosen with at least a wall 29 transparent to the incident beam 26. The beam 26 passes through the vessel wall 29 and the substrate 16 impinging on the metal film 19 which absorbs the light. By minimizing the space between the cathode 14 and the wall 29 of the vessel 10 one can reduce or eliminate the liquid through which the beam 26 passes. As can be seen from examining FIG. 2 it is in all other respects identical to that of FIG. 1.

The light beam 26 emitted from the light source 22 may be modulated by a modulator 28 which may be placed between the light source 22 and the lens system 24 or alternatively between the lens system 24 and the cathode 14. The modulator 28 may be a mechanical light chopper when the modulation rate is low or an optical modulator can be employed when more rapid modulation is sought.

A voltage source 31 is connected between the anode 20 and the cathode 14 making the cathode 14 negative with respect to the anode 20. A means for modulating the voltage 32 may be employed to synchronize the application of the potential supplied by the voltage source 31 with the modulation of the light.

When the voltage is applied as described above the metallic ions deposit onto the cathode 14. While there will be general deposition of metallic ions onto the surface 18' of the cathode 14 forming a background plating rate, preferential plating will occur at those regions where the light impinges. Modulating or the pulsing of the light provides sharper temperature profiles in the vicinity of the light exposed region 27' and improves the resolution between the enhanced plating region 27' and the background plating.

Modulation of the laser light has the effect of limiting the thermal spread which occurs in the substrate through thermal conduction and causes a decrease in the resolution. Synchronization of the laser light and the plating voltage has the advantage that plating is allowed to occur only when the laser has locally heated the substrate to produce the optimal temperature gradient. At other times during the modulation cycle the plating voltage is turned off thus reducing the background plating.

The rate of deposition on those regions that are exposed to light can be of the order of approximately $10^3$ times greater than the background where the light does not impinge. Mild etching of the cathode after the deposition is complete will remove the background deposit while leaving the desired pattern intact.

While the present invention has been described in terms of a single beam focused on the cathode one could employ multiple beams to simultaneously plate at multiple locations.

In the following specific examples of the invention the details are given by way of illustration and not by way of limitation.

EXAMPLE I

A glass substrate with approximately 1000 Å of Ni, vapor deposited thereon, is employed as a cathode. The electrolyte employed has the following composition:

21 gm Ni Cl$_2$
25 gm H$_3$BO$_3$
1.64 gm Na-Saccharinate (2 butyne, 1-4 diol)
1 l H$_2$O balance A DC plating potential of 1.5 volts is applied between the cathode and anode while an argon laser is focused to provide a beam passing through the electrolyte having a spot 20μ in diameter with an intensity of $2 \times 10^5$ W/cm$^2$. The spot is moved across the substrate by oscillation of a mirror in the path of the light source at the rate of 1 mm/sec giving an effective exposure time for the cathode of 20 μs. Under these operating conditions a line 10μ wide having a thickness between 0.2 and 0.4μ is produced.

EXAMPLE II

A glass substrate having approximately 1000 Å of W, vapor deposited thereon, is employed as a cathode. The laser source, electrolyte, and plating conditions are the same as Example I.

The spot diameter is decreased approximately 2 fold over that of Example I and results in a 4 fold increase in the power intensity of the light. The laser beam was pulsed by mechanical chopping. A pulse of light for 0.3 ms produces a spot 4μ diameter and approximately 0.05μ thickness.

EXAMPLE III

The laser source, electrolyte, cathode, and operating voltages are the same as Example II. The laser is focused as described in Example I but is not scanned across the surface. As the exposure time increases the thickness and diameter of the laser assisted Ni deposit increases as is illustrated in the following table:

| Thickness | Time | Diameter |
| --- | --- | --- |
| 6μ | 1 sec | 30μ |
| 5 | 1 | 30 |
| 9.5 | 2 | 35 |
| 9.5 | 2 | 35 |
| 12 | 4 | 40 |
| 12 | 4 | 40 |
| 14 | 8 | 45 |

It can be seen from examining the table that the resolution of the plating which is indicated by the spot size decreases as the time increases.

The background plating thickness for each case reported in this example was below 200 Å indicating that the laser will increase the plating rate by 3 orders of magnitude.

Furthermore, by comparing these results with Examples I and II it can be seen that the resolution can be further enhanced by pulsing the light source. Note that the spot size is reduced as the exposure time decreases.

EXAMPLE IV

A glass substrate having vapor deposited thereon two W lines separated by a 50μ break is employed as a cathode. The electrolyte and the operating conditions except for a somewhat larger beam size are substantially as in Example I. In this case the focused laser spot is moved to trace and retrace a path between the W lines depositing a Ni line which electrically reconnects the W lines. An impedance of several ohms exists after connection compared with the impedance of $3 \times 10^3$ before connection. The above described technique can be employed to personalize circuits.

EXAMPLE V

A cathode as described in Example 1 is employed. The electrolyte employed has the following composition:
200 gm Cu SO$_4$ 0.5H$_2$O
50 gm H$_2$SO$_4$ (concentrated)
1 l H$_2$O A DC plating voltage of 1 volt is applied. An argon laser is employed focused to 150μ diameter beam which passes through the electrolyte. The beam produces a spot size of approximately 140μ diameter on the cathode. The resulting power density of the beam is about 10$^4$ W/cm$^2$ and the exposure time is 20 sec. Under these operating conditions a copper spot is deposited onto the Ni which is 6μ thick and 140μ in diameter. No background plating is observed.

EXAMPLE VI

The cathode, electrolyte, laser and spot size are the same as described in Example V. However, the spot is scanned over a line of length 0.2 in. at the rate of 3 cycles per sec. for a period of 10 sec. This gives an effective total exposure time of 0.3 sec. The resulting line is 150μ wide and 0.56μ thick. Again, as in Example V the plating occurs only in the light exposed region.

EXAMPLE VII

A glass substrate with approximately 1000 Å of W vapor deposited thereon is employed as a cathode. The electrolyte employed has the following composition:
0.7–1.5 troy oz/gallon gold
acidic solution of gold cyanide
ph adjusted to 4.2–4.5.

A DC voltage of 1.5 volts is applied between the cathode and anode. An argon laser is focused to provide a beam passing through a glass substrate to the W film. A spot ~ 300μ in diameter with an intensity of $1 \times 10^2$ W/cm$^2$ used to expose the tungsten film. As the exposure time increased the thickness of the laser assisted Au deposit increased as is illustrated in the following table:

| Thickness | Time | Diameter |
| --- | --- | --- |
| 800A | 2 sec. | 300μ |
| 1000 | 3 | 300 |
| 1200 | 3 | 400 |
| 3000 | 6 | 400 |
| 3600 | 6 | 500 |

By comparing the results of Examples III and VII one can see that the rate of plating is a function of the power density of the beam. To obtain satisfactory enhancement it is preferred to employ power densities of at least $1 \times 10^2$ W/cm$^2$.

INDUSTRIAL APPLICABILITY

The inventive method of electroplating described above is well suited to applications where preferential deposition is desirable. The technique provides a method for placing conductive lines on chips used in integrated circuits and circuit boards. It is well suited for personalizing and repairing integrated circuits. Finally this method should find use in other applications where conductive lines must be deposited such as video display techniques.

While the novel features of the invention have been described in terms of preferred embodiments and for particular industrial applications, it will be understood that the various omissions and substitutions in the form and details of the method described may be made by those skilled in the art without departing from the spirit of the invention.

Having thus described our invention, what we claim as new, and desire to secure by Letters Patent is:

1. A method for electroplating a metal onto selective regions of the surface of a cathode comprising:
   placing the cathode in a non-photo decomposable electrolyte;
   placing an anode in said electrolyte and spaced apart from said cathode;
   directing a focusable beam of energy having an intensity between about $10^2$ W/cm$^2$ and $10^6$ W/cm$^2$ to heat said regions of said surface to be preferentially plated; and
   establishing an electrical potential between said anode and said cathode while said surface is heated by said energy beam to preferentially electroplate metal on said region.

2. The method of claim 1 wherein said energy source generates electromagnetic radiation and said cathode has a dielectric substrate which is rendered electrically conducting by depositing onto said surface a metallic layer.

3. The method of claim 2 wherein said metallic layer is chosen from the group of W, Mo, Ni, and Cu and said deposited metallic layer is between about 200 Å and 10,000 Å.

4. The method of claim 2 wherein said beam is laser generated.

5. The method of claim 4 wherein said beam is modulated.

6. The method of claim 5 wherein said potential is pulsed in synchronism with said modulated beam.

7. The method of claim 1 wherein said electrolyte is chosen to contain metallic ions from the group of Au, Ni, or Cu which are provided from their salts.

8. The method of claim 7 wherein said metallic ion is selected from the group Ni and Cu, and said beam is provided by an argon laser, said beam passing through said electrolyte.

9. The method of claim 7 wherein said metallic ion selected is Au and said beam is provided by a krypton laser tuned to 6471 Å, said beam passing through said electrolyte.

10. The method of claim 1 further comprising etching said plated electrolyte to remove the background plating from the nonpreferential plated regions.

11. The method of claim 1 wherein said collimated beam is laser generated.

12. The method of claim 11 wherein said beam is modulated.

13. The method of claim 12 wherein said potential is pulsed in synchronism with said modulated beam.

14. The method of claim 1 wherein said beam is generated by a laser, said cathode is chosen to have a glass substrate which is rendered conducting by depositing onto said surface a metallic layer of Ni, and further wherein said electrolyte is chosen to contain Cu ions which one provided from a copper bearing salt.

15. In a method for preferential electroplating of a metal onto regions of the surface of a cathode employing a non-photo decomposable electrolyte and an anode, the improvement comprising:
   directing a light beam having an intensity of at least $10^2$ W/cm$^2$ to heat the region of the surface where preferential plating is sought and applying an electroplating potential while said region is heated by said light beam to preferentially electroplate metal on said region.

* * * * *